United States Patent
Kim et al.

(10) Patent No.: US 12,464,707 B2
(45) Date of Patent: Nov. 4, 2025

(54) SEMICONDUCTOR DEVICE HAVING METAL NITRIDE GATE DOPED WITH A LOW WORK FUNCTION

(71) Applicant: SK hynix Inc., Gyeonggi-do (KR)

(72) Inventors: Dong Soo Kim, Gyeonggi-do (KR); Se Han Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 583 days.

(21) Appl. No.: 17/939,414

(22) Filed: Sep. 7, 2022

(65) Prior Publication Data
US 2023/0292494 A1    Sep. 14, 2023

(30) Foreign Application Priority Data
Mar. 10, 2022 (KR) .......................... 10-2022-0029939

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC .... H10B 12/053; H10B 12/34; H10B 12/488; H10D 30/024; H10D 30/62; H10D 64/027; H10D 64/517; H10D 64/667
USPC ................................................. 257/330, 332
See application file for complete search history.

(56) References Cited

U.S. PATENT DOCUMENTS 10,748,905 B2   8/2020  Lee et al.
10,964,704 B2   3/2021  Lee et al.
2021/0327882 A1* 10/2021 Liao .................... H10B 12/482

OTHER PUBLICATIONS

A. Fet et al., Lanthanum implantation for threshold voltage control in metal/high-k devices, Microelectronic Engineering, 2009, pp. 1782-1785, vol. 86, Elsevier.
C. Stampfl et al., Electronic structure and physical properties of early transition metal mononitrides: Density-functional theory LDA, GGA, and screened-exchange LDA FLAPW calculations, Physical Review B, 2001, pp. 155106-1-11, vol. 63, The American Physical Society.

* cited by examiner

*Primary Examiner* — Hoai V Pham
(74) *Attorney, Agent, or Firm* — IP & T GROUP LLP

(57) ABSTRACT

A semiconductor device includes: a trench formed in a substrate; a gate dielectric layer covering sidewalls and a bottom surface of the trench; a first gate electrode gap-filling a bottom portion of the trench over the gate dielectric layer; a second gate electrode including a metal nitride which is the same as the first gate electrode over the first gate electrode and doped with a low work function adjusting element; a buffer layer covering a top surface of the second gate electrode and the gate dielectric layer exposed over second gate electrode; and a capping layer gap-filling the other portion of the trench over the buffer layer.

11 Claims, 11 Drawing Sheets

SEMICONDUCTOR DEVICE HAVING METAL NITRIDE GATE DOPED WITH A LOW WORK FUNCTION

CROSS-REFERENCE TO RELATED APPLICATIONS

The present application claims priority of Korean Patent Application No. 10-2022-0029939, filed on Mar. 10, 2022, which is incorporated herein by reference in its entirety.

BACKGROUND

1. Field

Embodiments of the present invention relate generally to a semiconductor device and a method for fabricating the same, and more particularly, to a semiconductor device including a buried gate and a method of manufacturing the same.

2. Description of the Related Art

As the electronics industry is highly developed, the demand for high integration of semiconductor devices is increasing. This creates new challenges, such as a decrease in a process margin of an exposure process for defining fine patterns, making it increasingly more difficult to fabricate a semiconductor device. Also, with the development of the electronics industry, the demand for high-speed semiconductor devices is also increasing. Various studies are being conducted to fulfill the demands for high integration and/or high speed of the semiconductor devices.

SUMMARY

Embodiments of the present invention are directed to a semiconductor device with improved electrical properties, and a method for fabricating the semiconductor device.

In accordance with an embodiment of the present invention, a semiconductor device includes: a trench formed in a substrate; a gate dielectric layer covering sidewalls and a bottom surface of the trench; a first gate electrode gap-filling a bottom portion of the trench over the gate dielectric layer; a second gate electrode including a metal nitride which is the same as the first gate electrode over the first gate electrode and doped with a low work function adjusting element; a buffer layer covering a top surface of the second gate electrode and the gate dielectric layer exposed over the second gate electrode; and a capping layer gap-filling the other portion of the trench over the buffer layer.

In accordance with another embodiment of the present invention, a method for fabricating a semiconductor device includes: forming a trench in a substrate; forming a gate dielectric layer covering sidewalls and a bottom surface of the trench; forming a first gate electrode gap-filling a bottom portion of the trench over the gate dielectric layer; forming a second gate electrode including a metal nitride which is the same as the first gate electrode over the first gate electrode; forming a buffer layer covering a top surface of the second gate electrode and the gate dielectric layer exposed over the second gate electrode; doping the second gate electrode with a low work function adjusting element; and forming a capping layer over the buffer layer to gap-fill the other portion of the trench. These and other features and advantages of the present invention will become apparent to those with ordinary skill in the art from the following detailed description and drawings.

DETAILED DESCRIPTION

Figure 1:
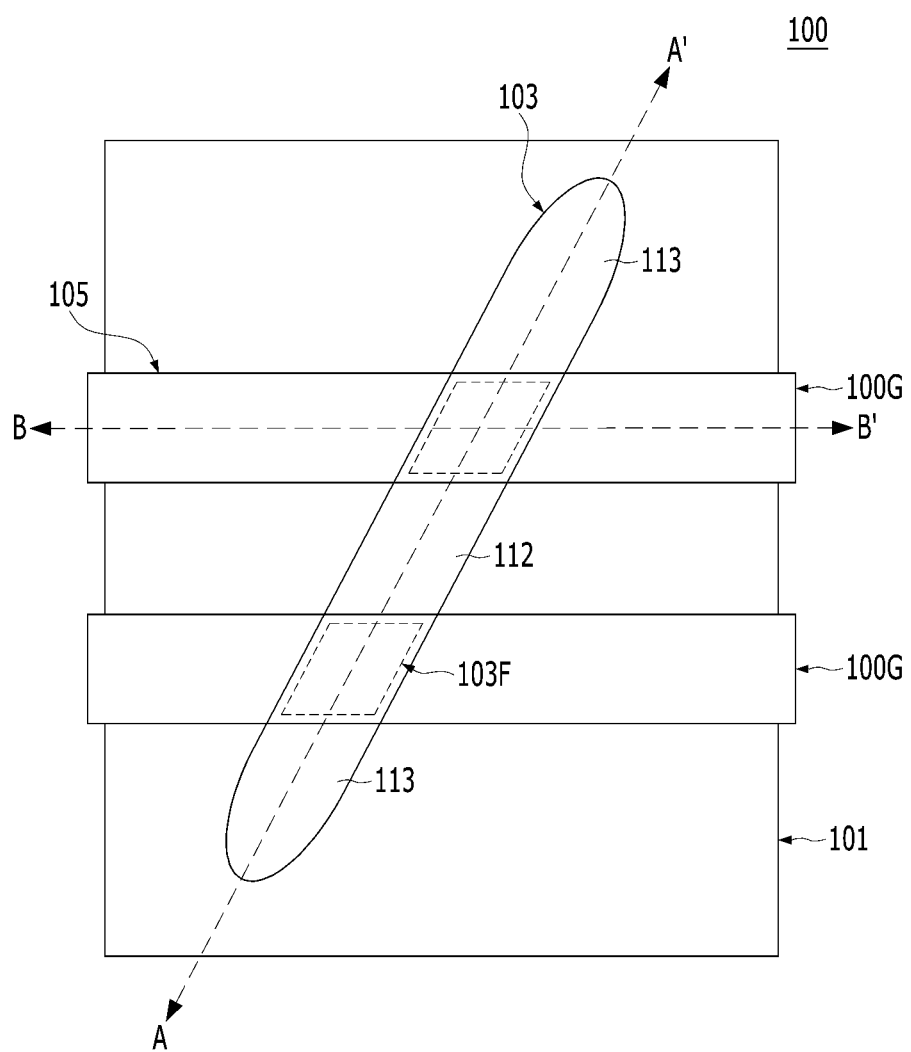
FIG. 1 is a plan view illustrating a semiconductor device in accordance with embodiments of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. When a first layer is referred to as being "on" a second layer or "on" a substrate, it not only refers to a case where the first layer is formed directly on the second layer or the substrate but also to a case where a third layer exists between the first layer and the second layer or the substrate.

Figure 2A:
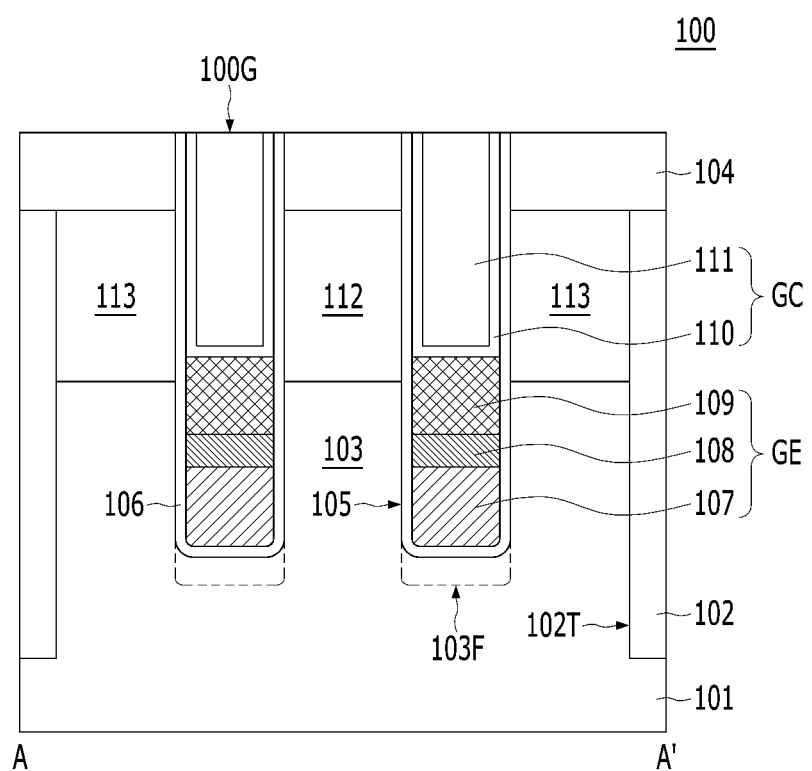
FIG. 2A is a cross-sectional view taken along a line A-A' of FIG. 1.
Figure 2B:
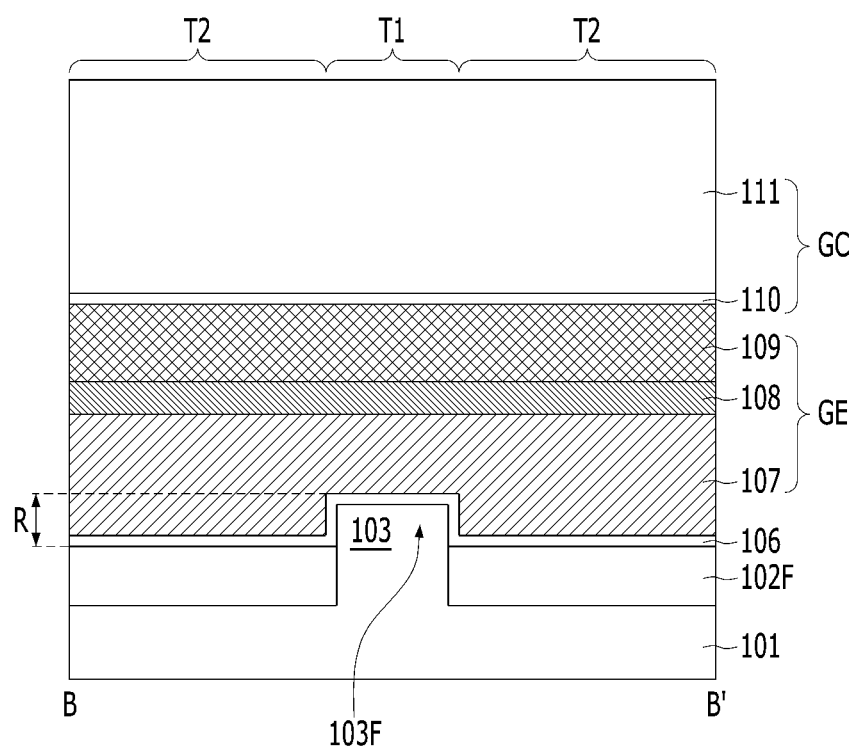
FIG. 2B is a cross-sectional view taken along a line B-B' of FIG. 1.

FIG. 1 is a plan view illustrating a semiconductor device in accordance with embodiments of the present invention. FIG. 2A is a cross-sectional view taken along a line A-A' of FIG. 1. FIG. 2B is a cross-sectional view taken along a line B-B' of FIG. 1.

Referring to FIGS. 1, 2A, and 2B, the semiconductor device 100 may include a substrate 101 and a buried gate structure 100G embedded in the substrate 101. The semiconductor device 100 may be a part of a memory cell. For example, the semiconductor device 100 may be a part of a memory cell of a Dynamic Random Access Memory (DRAM).

The substrate 101 may be formed of a material that is suitable for semiconductor processing. The substrate 101 may be a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include other semiconductor materials, such as germanium. The substrate 10 may include a III/V-group semiconductor substrate, for example, a compound semiconductor substrate, such as gallium arsenide (GaAs). The substrate 101 may include a Silicon-On-Insulator (SOI) substrate.

An isolation layer 102 and an active region 103 may be formed in the substrate 101. The active region 103 may be defined by the isolation layer 102. The isolation layer 102 may be a shallow trench isolation region (STI) formed by trench etching. The isolation layer 102 may be formed by filling a dielectric material in a shallow trench, for example, an isolation trench 102T. The isolation layer 102 may include, for example, silicon oxide, silicon nitride, or a combination thereof.

Referring to FIG. 1, a trench 105 may be formed in the substrate 101. The trench 105 may be formed by using the hard mask layer 104 as an etch barrier and etching the substrate 101. In a plan view according to the embodiment of FIG. 1, the trench 105 may have a line shape extending in one direction. The trench 105 may have a line shape crossing the active region 103 and the isolation layer 102. As it can be seen in FIG. 2A, the trench 105 may have a shallower depth than the isolation trench 102T. According to the illustrated embodiment of FIG. 2A, the bottom portion of the trench 105 may be generally flat with curved edges. In another embodiment of the present invention, the bottom portion of the trench 105 may have a curvature. The trench 105 may be a space in which the buried gate structure 100G is formed, and it is also referred herein as a gate trench 105.

A first doped region 112 and a second doped region 113 may be formed in the active region 103. The first doped region 112 and the second doped region 113 may be regions doped with a conductive dopant, such as, for example, phosphorus (P), arsenic (As), antimony (Sb), or boron (B). The first doped region 112 and the second doped region 113 may be doped with a dopant of the same conductivity type. The first doped region 112 and the second doped region 113 may be positioned in the active region 103 adjacent to opposite sides of the trench 105, respectively, meaning that the first doped region 112 is formed adjacent a first side of the trench 105 and the second doped region 113 is formed adjacent a second side that is opposite to the first side of the trench 105. In an embodiment of the present invention, a pair of trenches 105 may be disposed in one active region 103. In this case, the first side of the trench 105 may indicate each side of the pair of trenches 105 facing each other. The bottom surfaces of the first doped region 112 and the second doped region 113 may be positioned at a predetermined same depth from the top surface of the active region 103. The bottom surfaces of the first doped region 112 and the second doped region 113 may be positioned higher than the bottom surface of the trench 105. The first doped region 112 may be referred to as a 'first source/drain region', and the second doped region 113 may be referred to as a 'second source/drain region'. A channel may be defined between the first doped region 112 and the second doped region 113 by the buried gate structure 100G. The channel may be defined along the profile of the trench 105.

In the illustrated embodiment, the trench 105 may include a first trench T1 formed in the active region 103 and a second trench T2 formed in the isolation layer 102. The trench 105 may continuously extend from the first trench T1 to the second trench T2. In the trench 105, the bottom surface of the first trench T1 may be positioned at a higher level than the bottom surface of the second trench T2. The height difference between the first trench T1 and the second trench T2 may be formed as the isolation layer 102 is recessed. Accordingly, the second trench T2 may include a recess region R having a lower bottom surface than that of the first trench T1. A fin 103F may be formed in the active region 103 due to the height difference between the first trench T1 and the second trench T2. Therefore, the active region 103 may include the fin 103F.

As described above, the fin 103F may be formed below the first trench T1, and the sidewall of the fin 103F may be exposed by the recessed isolation layer 102F. The fin 103F may be a portion in which a part of the channel is formed. The fin 103F may be referred to as a saddle fin. The fin 103F may increase the width of the channel, and improve the electrical characteristics.

According to another embodiment of the present invention, the fin 103F may be omitted.

The buried gate structure 100G may include a gate dielectric layer 106 covering the bottom surface and sidewalls of the trench 105, and a gate electrode structure GE and a capping structure GC that are sequentially stacked to fill the trench 105 over the gate dielectric layer 106. The gate electrode structure GE may include a stacked structure of a first gate electrode 107, a diffusion barrier layer 108, and a second gate electrode 109. The first gate electrode 107 may fill a lower portion of the trench 105 over the gate dielectric layer 106. The diffusion barrier layer 108 may be formed over the first gate electrode 107, and the second gate electrode 109 may be formed over the diffusion barrier layer 108. The second gate electrode 109 may fill a middle portion of the trench 105. The capping structure GC may include a stacked structure of a buffer layer 110 and a capping layer 111 filling the upper portion of the trench 105 over the second gate electrode 109. The terms of the lower portion, the middle portion, and the upper portion of the trench 105 may be used for the sake of convenience in description, and the thickness (or depth) of each portion may be the same or different from each other.

The gate dielectric layer 106 may include silicon oxide, silicon nitride, silicon oxynitride, a high-k material, or a combination thereof. The high-k material may include a material having a higher dielectric constant than silicon oxide. For example, the high-k material may include a material having a dielectric constant of approximately 3.9 or more. To take another example, the high-k material may include a material having a dielectric constant of approximately 10 or more. To take another example, the high-k material may include a material having a dielectric constant of approximately 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, or a combination thereof. As for the high-k material, other known high-k materials may be selectively used. The gate dielectric layer 106 may include a metal oxide.

The top surface of the gate electrode structure GE may be positioned at a lower level than the top surface of the active region 103. The first gate electrode 107 may be formed to fill the bottom portion of the trench 105.

The top surface of the first gate electrode 107 may be positioned at a lower level than the bottom surfaces of the first and second doped regions 112 and 113. Accordingly, the first gate electrode 107 may not horizontally overlap with the first and second doped regions 112 and 113. The first gate electrode 107 may have a first work function and may be formed of a metal-based material. The first gate electrode 107 may include, for example, a metal nitride. For example, the first gate electrode 107 may include titanium nitride (TiN). The first gate electrode 107 may be formed by an Atomic Layer Deposition (ALD) process.

The second gate electrode 109 may partially or entirely overlap with the first and second doped regions 112 and 113 horizontally. The second gate electrode 109 may include the same metal nitride as that of the first gate electrode 107. The second gate electrode 109 may be formed by the same deposition method as that of the first gate electrode 107. The second gate electrode 109 may have the same film quality as that of the first gate electrode 107. The second gate electrode 109 may have a second work function which is lower than the first work function. The second gate electrode 109 may include, for example, titanium nitride which is doped with a low work function adjusting element. For example, the second gate electrode 109 may include lanthanum-doped titanium nitride (La-doped TiN).

The diffusion barrier layer 108 may be positioned between the first gate electrode 107 and the second gate electrode 109 and serve to prevent the low work function adjusting element which is doped onto the second gate electrode 109 from being diffused into the first gate electrode 107. To this end, the diffusion barrier layer 108 may include a metal material having a denser film quality than the first gate electrode 107 and the second gate electrode 109. The diffusion barrier layer 108 may include the same metal nitride as that of the first gate electrode 107. The diffusion barrier layer 108 may be formed by a deposition method which is different from the deposition method of the first gate electrode 107. For example, the barrier layer 108 may include titanium nitride (TiN) which is formed by a Physical Vapor Deposition (PVD) process.

The capping structure GC may include the buffer layer 110 that covers the top surface of the second gate electrode 109 and the sidewall of the gate dielectric layer 106 exposed over second gate electrode 109, and a capping layer 111 that gap-fills the other portion of the trench 105 over the buffer layer 110. The buffer layer 110 may include a dielectric material. The buffer layer 110 and the capping layer 111 may include the same material. For example, the buffer layer 110 and the capping layer 111 may include silicon nitride.

According to an embodiment of the present invention, it may be possible to prevent a low work function adjusting element from being diffused into the first gate electrode 107 by disposing the diffusion barrier layer 108 having a dense film quality between the first gate electrode 107 and the second gate electrode 109. Accordingly, even though a high work function is formed and thus the channel concentration is reduced or a channel doping process is omitted, the first gate electrode 107 overlapping with the channel can adjust the threshold voltage by shifting a flat band voltage. Also, the second gate electrode 109 overlapping with the first and second doped regions 112 and 113 can form a low work function to reduce the Gate-Induced Drain Leakage GIDL.

Also, according to the embodiment of the present invention, the first and second gate electrodes 107 and 109 and the diffusion barrier layer 108 may be formed to contain the same metal nitride, thereby increasing the volume occupied by the metal of the gate electrode. Accordingly, it is possible to reduce the specific resistance of the gate electrode and to improve the resistance Rs of a device.

FIGS. 3A to 3E are cross-sectional views illustrating a method for fabricating a semiconductor device in accordance with an embodiment of the present invention. FIGS. 3A to 3E illustrate an example of a method for fabricating the semiconductor device shown in FIG. 2A.

Figure 3A:
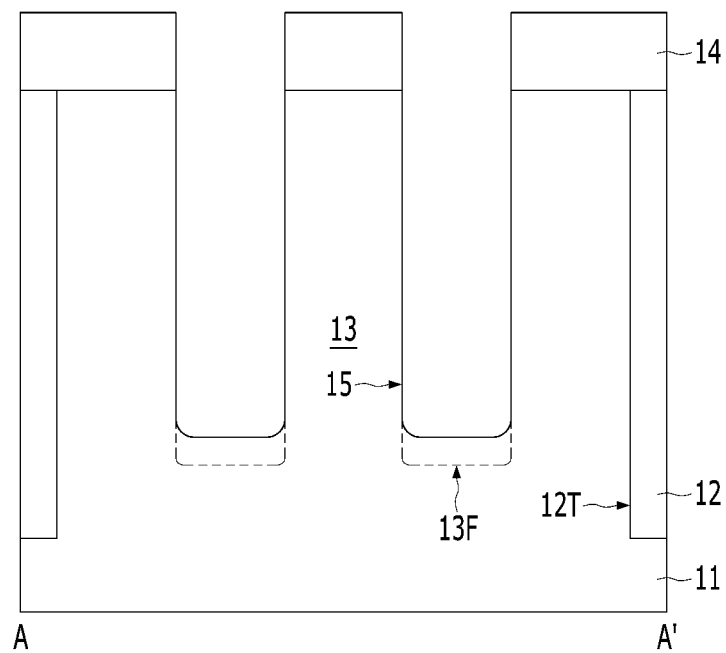
FIGS. 3A to 3E are cross-sectional views illustrating a method for fabricating a semiconductor device in accordance with an embodiment of the present invention.

Referring to FIG. 3A, an isolation layer 12 may be formed over the substrate 11. An active region 13 may be defined by the isolation layer 12. The isolation layer 12 may be formed by a Shallow Trench Isolation (STI) process. For example, the substrate 11 may be etched to form the isolation trench 12T. The isolation trench 12T may be filled with a dielectric material to form the isolation layer 12. The isolation layer 12 may include silicon oxide, silicon nitride, or a combination thereof. A Chemical Vapor Deposition (CVD) or other deposition process may be used to fill the isolation trench 12T with a dielectric material. A planarization process such as Chemical Mechanical Polishing (CMP) may additionally be used.

A trench 15 may be formed in the substrate 11. The trench 15 may be formed in a line shape crossing the active region 13 and the isolation layer 12. The trench 15 may be formed by an etching process of the substrate 11 using a hard mask layer 14 as an etching mask. The hard mask layer 14 may be formed over the substrate 11 and may have a line-shaped opening. The hard mask layer 14 may be formed of a material having an etch selectivity with respect to the substrate 11. The hard mask layer 14 may be formed of silicon oxide, such as tetra ethyl ortho silicate (TEOS). The trench 15 may be formed to be shallower than the isolation trench 12T. The trench 15 may have a sufficient depth to increase the average cross-sectional area of a gate electrode, which is to be formed subsequently. Therefore, the resistance of the gate electrode can be reduced. According to another embodiment of the present invention, the bottom edge of the trench 15 may have a curvature.

Subsequently, a fin 13F may be formed. The fin 13F may be formed by selectively recessing the isolation layer 12 below the trench 15. The fin 13F has the same structure as the fin 103F of FIG. 2B.

Figure 3B:
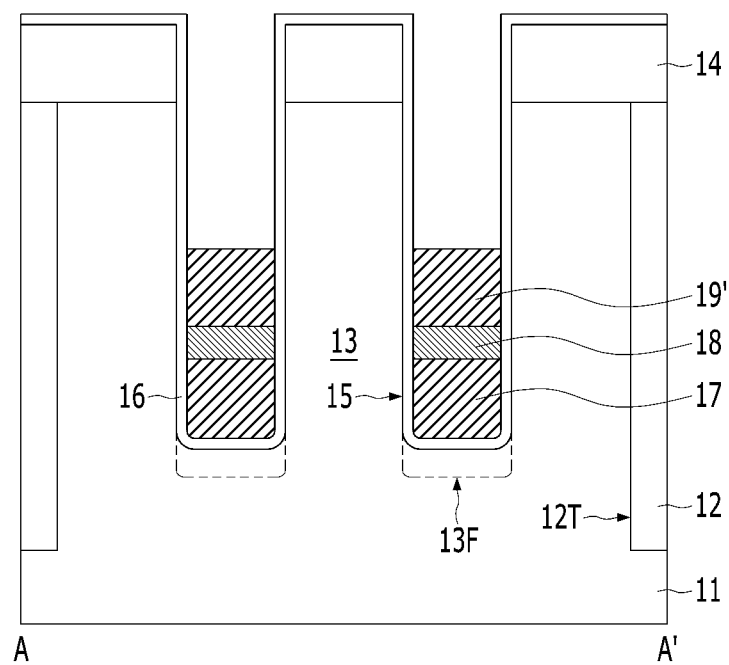

Referring to FIG. 3B, a gate dielectric layer 16 may be formed on the surface of the trench 15. Before the gate dielectric layer 16 is formed, the damage from the etching process on the surface of the trench 15 may be cured. For example, after a sacrificial oxide is formed by thermal oxidation, the sacrificial oxide may be removed. The gate dielectric layer 16 may be formed by a thermal oxidation process. The gate dielectric layer 16 may include silicon oxide. According to another embodiment of the present invention, the gate dielectric layer 16 may be formed by Chemical Vapor Deposition (CVD) or Atomic Layer Deposition (ALD). The gate dielectric layer 16 which is formed by a deposition method may include a high-k material, an oxide, nitride, oxynitride, or a combination thereof. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, or combinations thereof. As for the high-k material, other known high-k materials may optionally be used. The gate dielectric layer 16 may include a stack of silicon oxide and a high-k material, where the high-k material may include a material having a higher oxygen atomic areal density than silicon oxide.

Subsequently, first and second gate electrodes 17 and 19' filling a portion of the trench 15 and separated by the diffusion barrier layer 18 may be formed over the gate dielectric layer 16.

First, for the first gate electrode 17, a conductive material may be formed over the gate dielectric layer 16 and the hard mask layer 14, and a recessing process may be performed to fill the bottom portion of the trench 15. The recessing process may be performed by a dry etching process, for example, an etch-back process. The etch-back process may be performed using plasma. The first gate electrode 17 may include a high work function material. The first gate electrode 17 may include a low-resistance material. For example, the first gate electrode 17 may include titanium nitride (TiN).

Subsequently, a diffusion barrier layer 18 may be formed over the first gate electrode 17. The diffusion barrier layer 18 may include a metal material having a denser film quality than the first gate electrode 17. The diffusion barrier layer 18 may include the same metal nitride as that of the first gate electrode 17. The diffusion barrier layer 18 may be formed by a deposition process which is different from that of the first gate electrode 17. The diffusion barrier layer 18 may include, for example, titanium nitride (PVD TiN) which is formed by a physical vapor deposition (PVD) process. According to another embodiment of the present invention, the diffusion barrier layer 18 may include titanium nitride which is formed by another deposition process which is capable of securing a dense film quality. According to another embodiment of the present invention, the diffusion barrier layer 18 may have a denser film quality than that of the first gate electrode 17 and include a metal material which is different from that of the first gate electrode 17.

Subsequently, a second gate electrode 19' may be formed over the diffusion barrier layer 18. The second gate electrode 19' may include the same material as that of the first gate electrode 17. For example, the second gate electrode 19' may include titanium nitride. The second gate electrode 19' may include titanium nitride which is formed by the same deposition process as that of the first gate electrode 17.

Figure 3C:
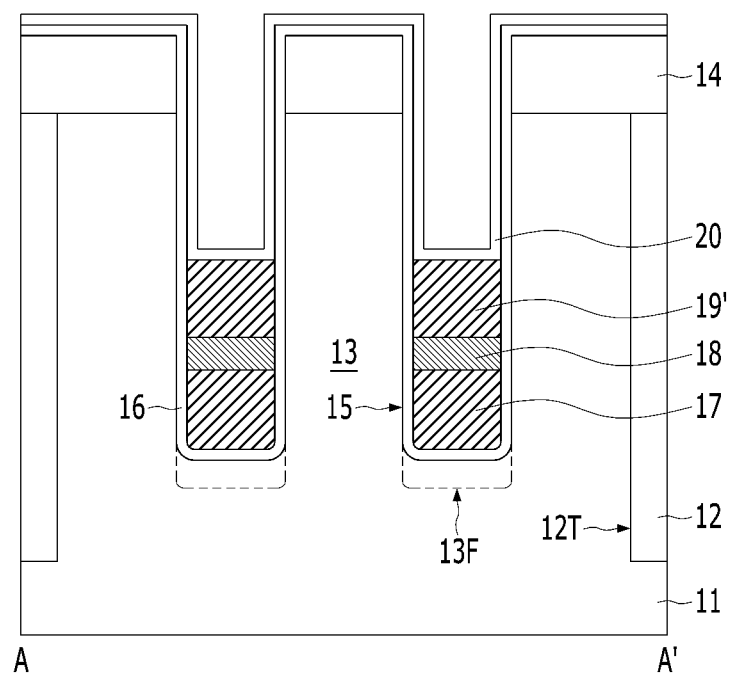

Referring to FIG. 3C, a buffer layer 20 that covers the top surface of the second gate electrode 19' and the gate dielectric layer 16 exposed over second gate electrode 19' may be formed. The buffer layer 20 may prevent a dopant to be doped onto the second gate electrode 19' from being unnecessarily doped onto or diffused into the gate dielectric layer 16 in the subsequent process. The buffer layer 20 may include a dielectric material. For example, the buffer layer 20 may include silicon nitride.

Figure 3D:
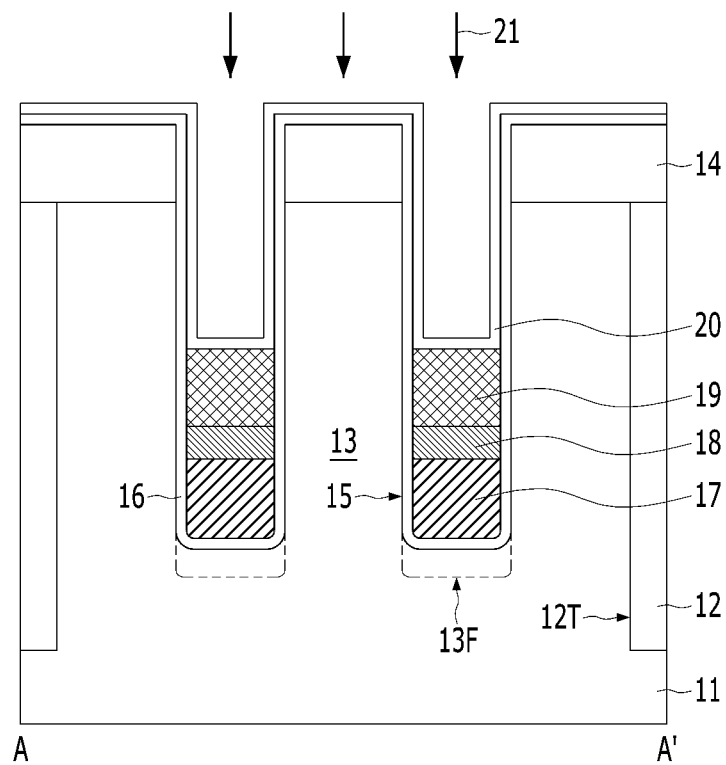

Referring to FIG. 3D, a doping process 21 using a low work function adjusting element may be performed. The doping process 21 may proceed by targeting the second gate electrode 19. As a result, a second gate electrode 19 which is doped with the low work function adjusting element may be formed. For example, the low work function adjusting element may include lanthanum (La). The second gate electrode 19 may include lanthanum-doped titanium nitride (La-doped TiN). The second gate electrode 19 may have a lower work function than the first gate electrode 17.

During the doping process 21, the diffusion barrier layer 18 below the second gate electrode 19 may prevent the low work function adjusting element from being doped onto or diffused into the first gate electrode 17. As a result, it may be possible to prevent the work function of the first gate electrode 17 from being lowered due to the low work function adjusting element. Also, the buffer layer 20 may prevent the low work function adjusting element from being directly doped onto or diffused into the gate dielectric layer 16. Accordingly, it is possible to prevent the gate dielectric layer 16 from reacting with the low work function adjusting element and being replaced with lanthanum silicate. As a comparative example, it may be difficult to remove lanthanum silicate, which may increase the process difficulty.

Figure 3E:
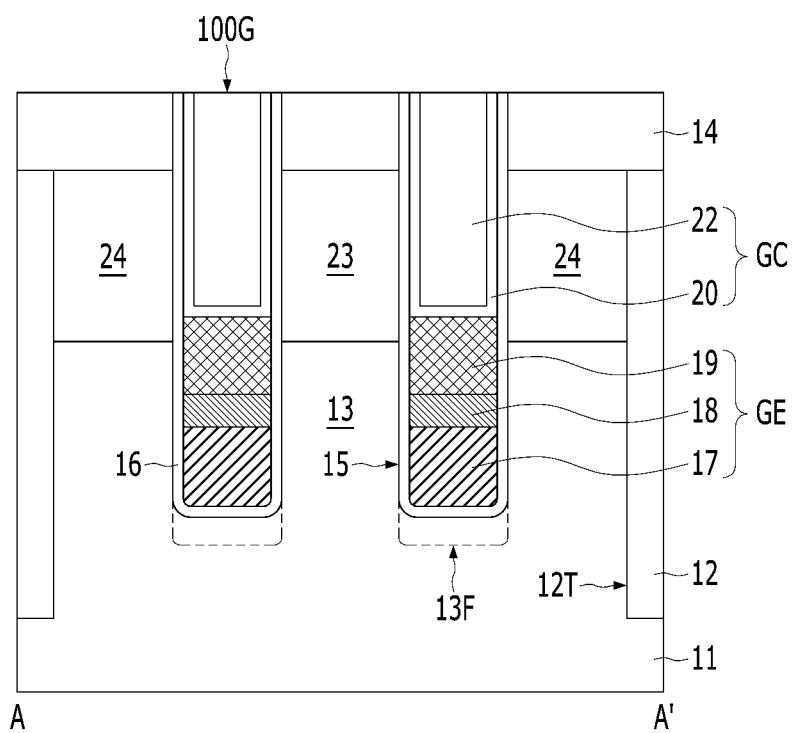

Referring to FIG. 3E, a capping layer 22 that gap-fills the other portion of the trench 15 may be formed over the buffer layer 20. The capping layer 22 may include the same material as that of the buffer layer 20. The capping layer 22 may include a dielectric material. For example, the capping layer 22 may include silicon nitride. Subsequently, planarization may be performed onto the capping layer 22 and the buffer layer 20 such that the top surface of the hard mask layer 14 may be exposed. As a result, the capping structure GC filling the trench 15 may remain.

A buried gate structure 100G may be formed by a series of processes described above. The buried gate structure 100G may include the gate dielectric layer 16, the gate electrode structure GE, and the capping structure GC. The gate electrode structure GE may include the first gate electrode 17 having a high work function, the second gate electrode 19 having a low work function, and the diffusion barrier layer 18 which is interposed between the first gate electrode 17 and the second gate electrode 19 and has a dense film quality. The capping structure GC may include a stacked structure of the buffer layer 20 and the capping layer 22.

Subsequently, an impurity doping process may be performed, for example, by implantation or some other doping technique. Accordingly, a first doped region 23 and a second doped region 24 may be formed in the substrate 11. The first doped region 23 and the second doped region 24 may horizontally overlap with part or all of the second gate electrode 19. The first gate electrode 17 may not horizontally overlap with the first and second doped regions 23 and 24. The first and second doped regions 23 and 24 may be referred to as first and second source/drain regions.

As the first and second doped regions 23 and 24 are formed, a channel may be defined along the surface of the trench 15.

Figure 4A:
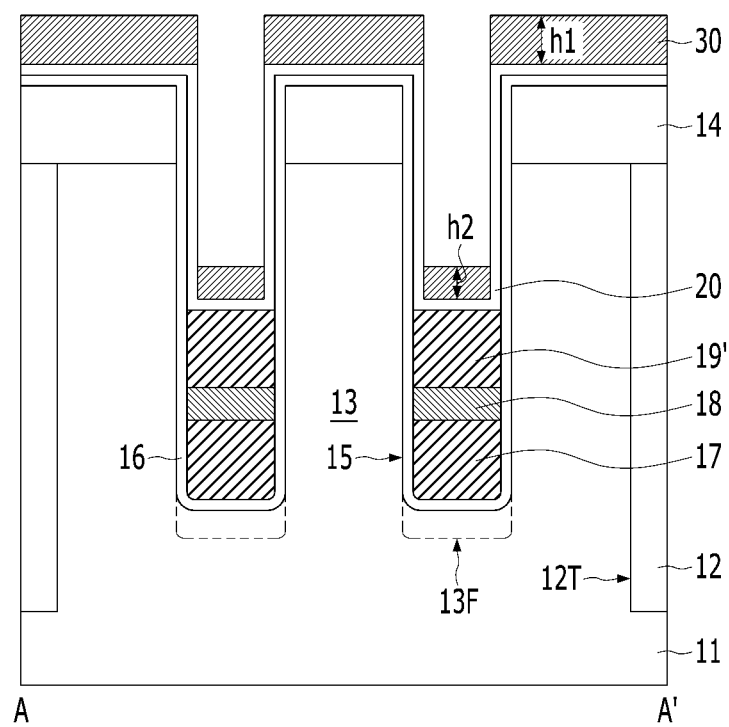
FIGS. 4A to 4C are cross-sectional views illustrating a method for fabricating a semiconductor device in accordance with another embodiment of the present invention.
Figure 4B:
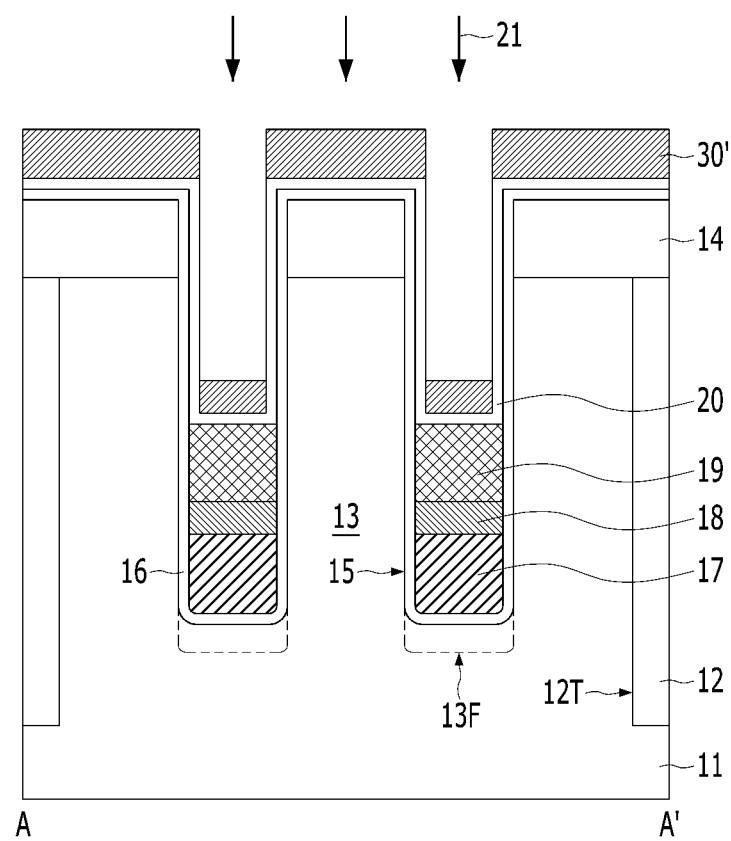
Figure 4C:
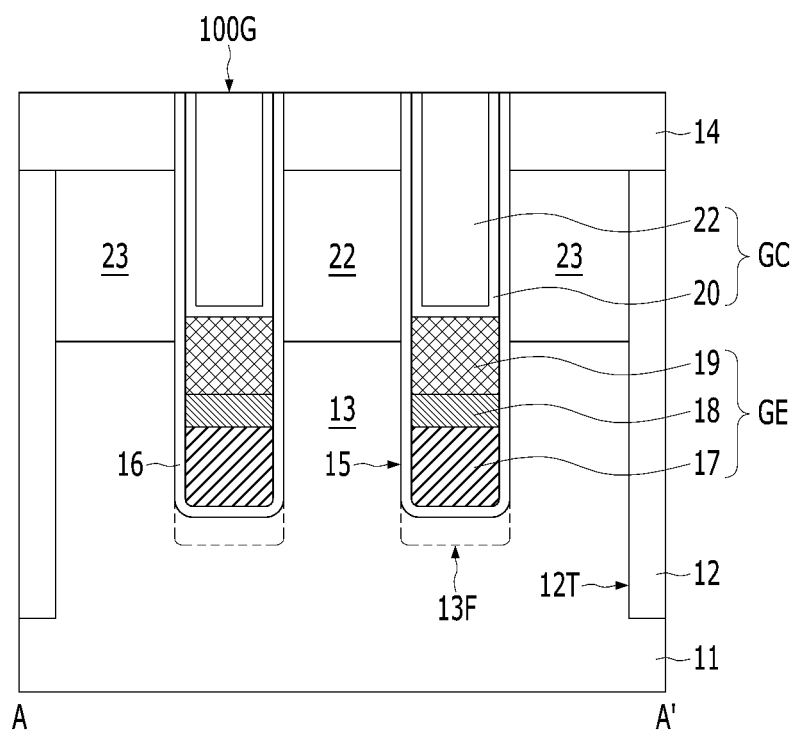

FIGS. 4A to 4C are cross-sectional views illustrating a method for fabricating a semiconductor device in accordance with another embodiment of the present invention. FIGS. 4A to 4C may include the same processes as those of FIGS. 3A to 3C, except for some processes.

First, by the method illustrated in FIGS. 3A to 3C, the gate dielectric layer 16 in the trench 15, the first gate electrode 17 over the gate dielectric layer 16, the diffusion barrier layer 18, the second gate electrode 19' and the buffer layer 20 may be formed.

Subsequently, as illustrated in FIG. 4A, a sacrificial barrier layer 30 may be formed over the hard mask 14. The sacrificial barrier layer 30 may serve to prevent unnecessary doping of the dopant onto the hard mask layer 14 during a subsequent doping process. The sacrificial barrier layer 30 may also be formed over the buffer layer 20 in the trench 15 in addition to the top of the hard mask layer 14. The sacrificial barrier layer 30 may have a thickness h1 over the hard mask layer 14 thicker than a thickness h2 over the buffer layer 20.

The sacrificial barrier layer 30 includes the same material as the diffusion barrier layer 18. The sacrificial barrier layer 30 may be formed through the same deposition process as that of the diffusion barrier layer 18. For example, the sacrificial barrier layer 30 may include titanium nitride (TiN) formed through a physical vapor deposition (PVD) process.

Referring to FIG. 4B, the doping process 21 using a low work function adjusting element may be performed. The doping process 21 may target the second gate electrode 19. Accordingly, the second gate electrode 19 doped with the low work function adjusting element may be formed. For example, the low work function adjusting element may include lanthanum (La). The second gate electrode 19 may include lanthanum-doped titanium nitride (La-doped TiN).

During the doping process 21, the diffusion barrier layer 18 below the second gate electrode 19 may prevent the low work function adjusting element from being doped onto or diffused into the first gate electrode 17. The buffer layer 20 may prevent the low work function adjusting element from being directly doped onto or diffused into the gate dielectric layer 16. The sacrificial barrier layer 30' may prevent the low work function adjusting element from being doped onto the hard mask layer 14. Here, the sacrificial barrier layer 30' may refer to the sacrificial barrier layer 30 that is doped with a low work function adjusting element (refer to FIG. 4A).

Subsequently, the sacrificial barrier layer 30' may be removed. As a result, the gate dielectric layer 16 covering the trench 15, and a stacked structure of the first gate electrode 17, the diffusion barrier layer 18, the second gate electrode 19, and the buffer layer 20 that are formed over the gate dielectric layer 16 may remain in the trench 15.

Referring to FIG. 4C, a capping layer 22 that gap-fills the remainder of the trench 15 may be formed over the buffer layer 20. The capping layer 22 may include the same material as the buffer layer 20. The capping layer 22 may include a dielectric material. For example, the capping layer 22 may include silicon nitride. Subsequently, planarization of the capping layer 22 and the buffer layer 20 may be performed to expose the top surface of the hard mask layer 14. Accordingly, the capping structure GC filling the trench 15 may remain.

A buried gate structure 100G may be formed by a series of the processes, which are described above. The buried gate structure 100G may include the gate dielectric layer 16, the gate electrode structure GE, and the capping structure GC. The gate electrode structure GE may include the first gate electrode 17 having a high work function, the second gate electrode 19 having a low work function, and the diffusion barrier layer 18 having dense film quality and interposed between the first gate electrode 17 and the second gate electrode 19. The capping structure GC may include a stacked structure of the buffer layer 20 and the capping layer 22.

Subsequently, an impurity doping process may be performed by implantation or other doping technique. Accordingly, a first doped region 23 and a second doped region 24 may be formed in the substrate 11. The first doped region 23 and the second doped region 24 may horizontally overlap with part or all of the second gate electrode 19. The first gate electrode 17 may not horizontally overlap with the first and second doped regions 23 and 24. The first and second doped regions 23 and 24 may be referred to as first and second source/drain regions.

As the first and second doped regions 23 and 24 are formed, a channel may be defined along the profile of the surface of the trench 15.

According to an embodiment of the present invention, the resistance Rs may be decreased by increasing the volume of a gate electrode including a metal material.

According to an embodiment of the present invention, diffusion of a low work function adjusting element may be prevented by interposing a diffusion barrier layer having a dense film quality between the gate electrodes.

According to an embodiment of the present invention, it is possible to prevent unnecessary reactions between the low work function adjusting element and the gate dielectric layer by forming a buffer layer on a portion of a sidewall of a gate dielectric layer.

According to an embodiment of the present invention, Gate-Induced Drain Leakage (GIDL) is substantially reduced by doping a low work function adjusting element onto the gate electrode overlapping with the source/drain regions.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to specific embodiments, it will be apparent to those skilled in the art that various changes and modifications may be made without departing from the spirit and scope of the invention as defined in the following claims.

What is claimed is:

1. A semiconductor device comprising:
   a trench formed in a substrate;
   a gate dielectric layer covering sidewalls and a bottom surface of the trench;
   a first gate electrode gap-filling a bottom portion of the trench over the gate dielectric layer;
   a second gate electrode including a metal nitride which is the same as the first gate electrode over the first gate electrode and doped with a low work function adjusting element;
   a buffer layer covering a top surface of the second gate electrode and the gate dielectric layer exposed over the second gate electrode; and
   a capping layer gap-filling the trench over the buffer layer.

2. The semiconductor device of claim 1, wherein the buffer layer includes a dielectric material.

3. The semiconductor device of claim 1, wherein the buffer layer includes a silicon nitride.

4. The semiconductor device of claim 1, wherein the buffer layer and the capping layer include the same material.

5. The semiconductor device of claim 1, wherein the first and second gate electrodes include titanium nitride.

6. The semiconductor device of claim 1, wherein the low work function adjusting element includes lanthanum (La).

7. The semiconductor device of claim 1, further comprising:
   a diffusion barrier layer between the first gate electrode and the second gate electrode.

8. The semiconductor device of claim 7, wherein the diffusion barrier layer includes a metal material having a denser film quality than the first gate electrode.

9. The semiconductor device of claim 7, wherein the diffusion barrier layer includes a metal nitride which is the same as the first and second gate electrodes.

10. The semiconductor device of claim 7, wherein the diffusion barrier layer includes titanium nitride (TiN) formed by a physical vapor deposition (PVD) process.

11. The semiconductor device of claim 1, further comprising:
   a source/drain region formed in the substrate on both sides of the trench.

* * * * *